(12) United States Patent
Tien et al.

(10) Patent No.: US 12,255,142 B2
(45) Date of Patent: *Mar. 18, 2025

(54) CELL STRUCTURE WITH INTERMEDIATE METAL LAYERS FOR POWER SUPPLIES

(71) Applicant: Taiwan Semiconductor Manufacturing Company, Ltd., Hsinchu (TW)

(72) Inventors: Li-Chun Tien, Tainan (TW); Chih-Liang Chen, Hsinchu (TW); Hui-Zhong Zhuang, Kaohsiung (TW); Shun Li Chen, Hsinchu (TW); Ting Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,005

(22) Filed: Aug. 10, 2023

(65) Prior Publication Data

US 2023/0387015 A1 Nov. 30, 2023

Related U.S. Application Data

(63) Continuation of application No. 17/728,007, filed on Apr. 25, 2022, now Pat. No. 11,764,155, which is a (Continued)

(51) Int. Cl.
*H01L 23/528* (2006.01)
*H01L 21/8238* (2006.01)
(Continued)

(52) U.S. Cl.
CPC .. *H01L 23/5286* (2013.01); *H01L 21/823821* (2013.01); *H01L 21/823871* (2013.01); *H01L 23/5226* (2013.01); *H01L 27/0924* (2013.01)

(58) Field of Classification Search
None
See application file for complete search history.

(56) References Cited

U.S. PATENT DOCUMENTS 8,723,225 B2 5/2014 Hu et al.
11,315,874 B2 * 4/2022 Tien .................... H01L 23/5226
(Continued)

FOREIGN PATENT DOCUMENTS

KR 10-2018-0077045 A 7/2018
TW 201415627 A 4/2014
TW 202017136 A 5/2020

*Primary Examiner* — Hsien Ming Lee
(74) *Attorney, Agent, or Firm* — Merchant & Gould P.C.

(57) ABSTRACT

A cell on an integrated circuit is provided. The cell includes: a fin structure; an intermediate fin structure connection metal track disposed in an intermediate fin structure connection metal layer above the fin structure, the intermediate fin structure connection metal track being connected to the fin structure; and a first intermediate gate connection metal track disposed in an intermediate gate connection metal layer above the intermediate fin structure connection metal layer, the first intermediate gate connection metal track being connected to the intermediate fin structure connection metal track. A first power supply terminal is connected to the first intermediate gate connection metal track.

20 Claims, 6 Drawing Sheets

Related U.S. Application Data continuation of application No. 17/021,051, filed on Sep. 15, 2020, now Pat. No. 11,315,874.

(51) Int. Cl.
*H01L 23/522* (2006.01)
*H01L 27/092* (2006.01)

(56) References Cited

U.S. PATENT DOCUMENTS

| | | |
|---|---|---|
| 11,764,155 B2 * | 9/2023 | Tien .................. H01L 23/5226 257/369 |
| 2016/0064373 A1 | 3/2016 | Narita |
| 2017/0133365 A1 | 5/2017 | Lim et al. |
| 2018/0183414 A1 | 6/2018 | Guo et al. |
| 2020/0091348 A1 | 3/2020 | Guha et al. |
| 2020/0134128 A1 | 4/2020 | Peng et al. |
| 2020/0251502 A1 | 8/2020 | Lilak et al. |

* cited by examiner

CELL STRUCTURE WITH INTERMEDIATE METAL LAYERS FOR POWER SUPPLIES

CROSS-REFERENCE TO RELATED APPLICATION

This application is a continuation of U.S. patent application Ser. No. 17/728,007 filed Apr. 25, 2022, which is a continuation of U.S. patent application Ser. No. 17/021,051 filed Sep. 15, 2020, now U.S. Pat. No. 11,315,874, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a constant need to develop ICs with smaller chip areas, lower costs, and better power conversion efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In today's standard-logic-cell based application specific integrated circuit (ASIC) design, the logic function of the chip is modeled and simulated in higher-level hardware description languages (e.g., VHDL or VERILOG). It is then synthesized in a silicon compiler (e.g. SYNOPSIS) to generate a netlist using standard logic cells from a targeted standard-cell library. The netlist will be used in the backend physical design phase to perform the "Place and Route" of standard logic cells, generating the full circuit layout of the ASIC for manufacturing.

Integrated circuit (IC) front-end fabrication generally includes two portions: the front-end-of-line (FEOL) and the back-end-of-line (BEOL). The FEOL is the first portion where the individual devices (transistors, capacitors, resistors, etc.) are patterned in the IC. The FEOL generally covers everything up to (but not including) the deposition of metal interconnect layers. The BEOL is the second portion where the individual devices get interconnected with the metallization layer. Common metals used are copper aluminum, silver, and gold. The BEOL generally begins when the first layer of metal is deposited. The BEOL includes, among other things, contacts, insulating layers (e.g., dielectrics), metal levels, and bonding sites for chip-to-package connections. For modern IC fabrication, more than ten metal layers may be added in the BEOL. After the BEOL, there is a "back-end process" which generally includes wafer test, wafer back-grinding, die separation, die tests, IC packaging and final test.

Cell heights are constantly decreasing (e.g., from 384 nm to 360 nm) to achieve smaller chip areas, lower costs. As cell heights decrease, metal layer routing resources in the BEOL become scarcer. Specifically, less metal layer tracks can be put in standard logic cells with smaller cell heights.

In accordance with some aspects of the present disclosure, unlike a benchmark cell with the same cell height, a cell does not utilize a first metal (M1) layer in the BEOL to be connected to power supply terminals (e.g., a higher voltage level VDD and a lower voltage level VSS). Instead, the cell utilizes intermediate gate connection metal layer to be connected to the power supply terminals, with the help of a power connecting cell. As such, routing resources in the M1 layer can be saved and more M1 layer tracks can be used for routing.

Figure 1A:
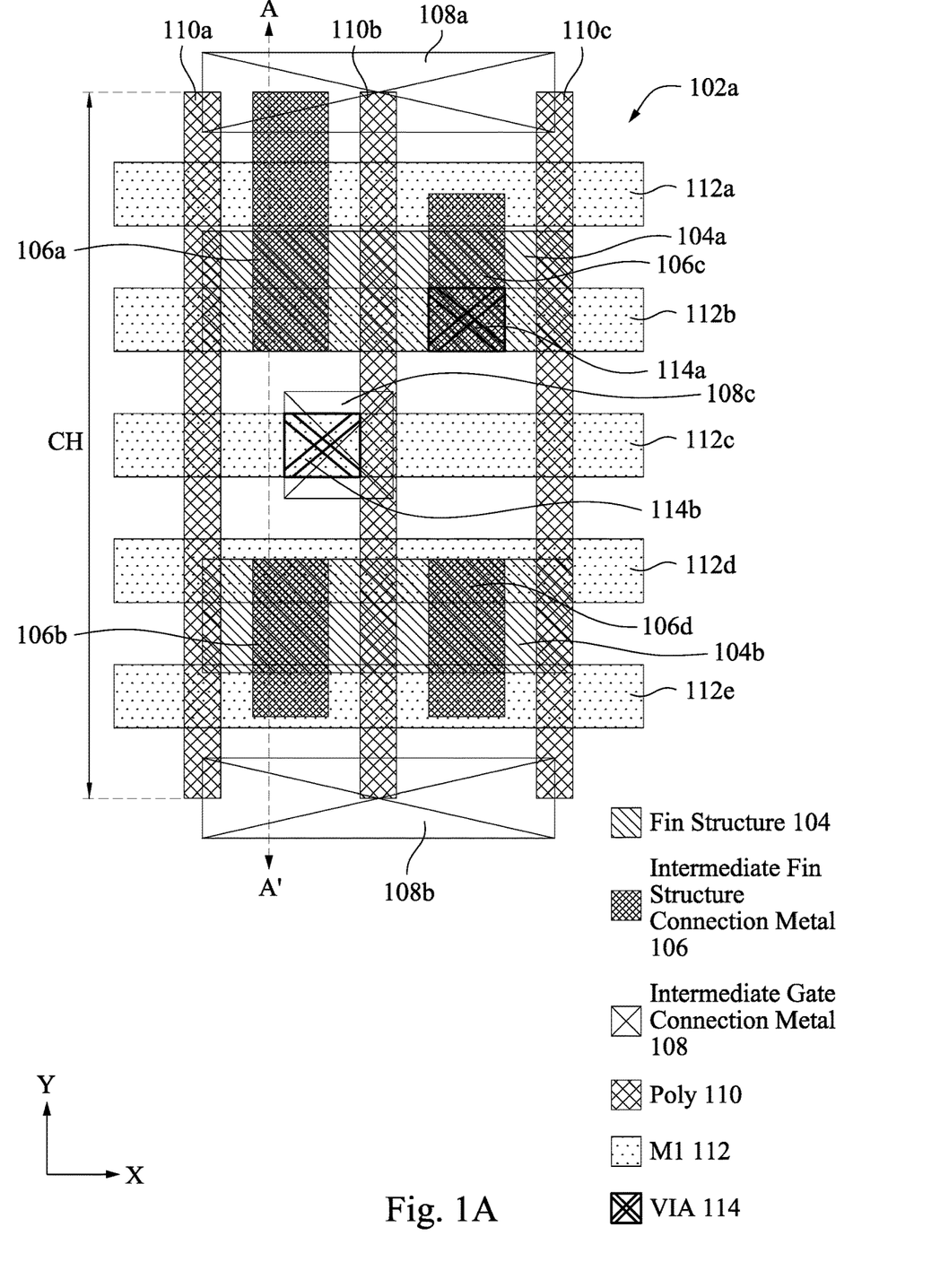
FIG. 1A is a layout diagram illustrating an integrated circuit (IC) layout of a cell in accordance with some embodiments.
Figure 1B:
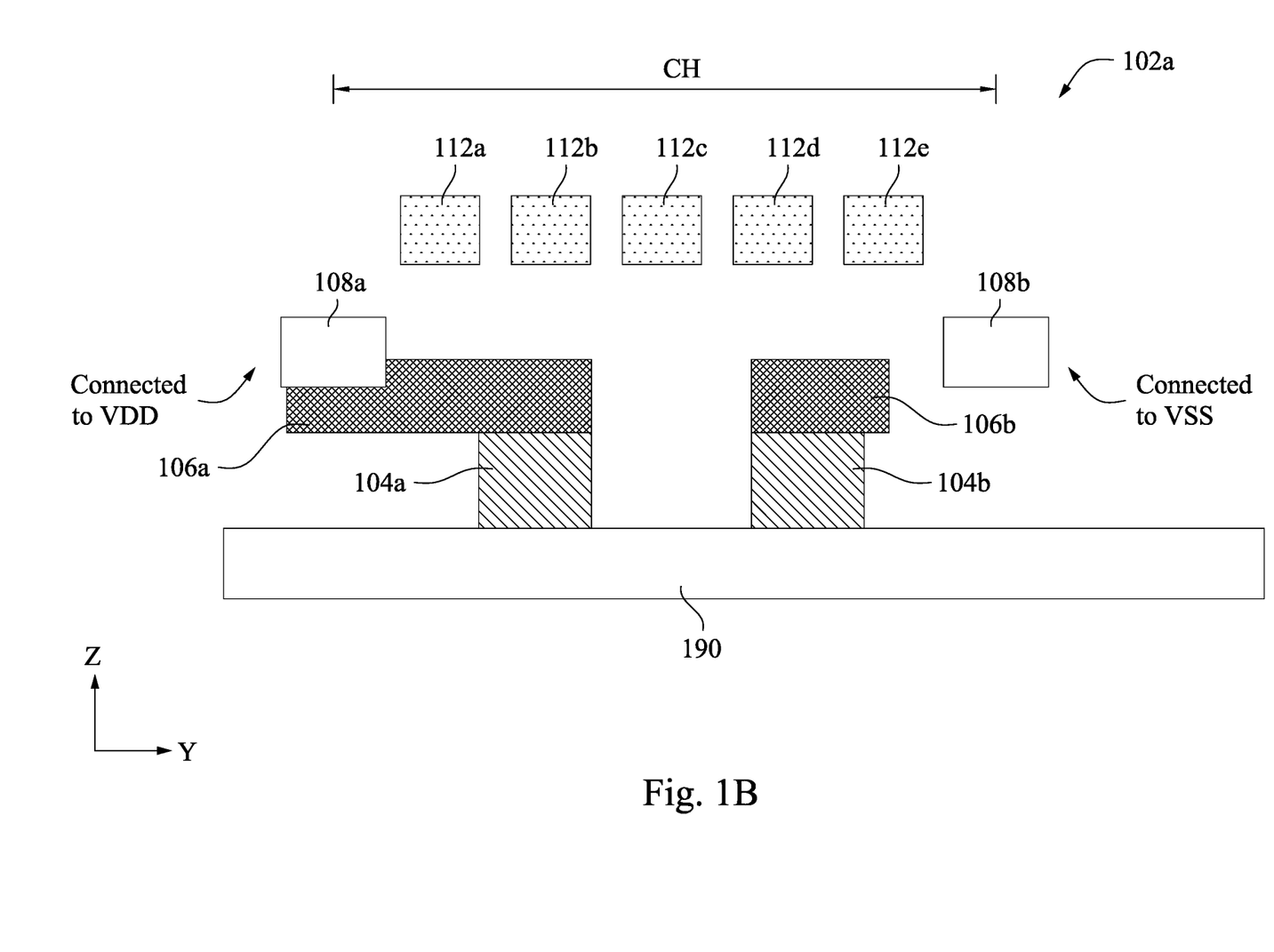
FIG. 1B is a cross-sectional diagram of the cell of FIG. 1A taken at a line A-A' in accordance with some embodiments.

FIG. 1A is a layout diagram illustrating an integrated circuit (IC) layout of a cell 102a in accordance with some embodiments. FIG. 1B is a cross-sectional diagram of the cell 102a of FIG. 1A taken at a line A-A' in accordance with some embodiments. The cell 102a has a cell height CH, and the cell height CH is a reduced cell height (e.g. 360 nm compared with 384 nm). It should be noted that the cell height CH can be other heights. Unlike a benchmark cell with the same cell height CH, the cell 102a does not utilize a first metal (M1) layer 112 in the BEOL to be connected to power supply terminals (e.g., a higher voltage level VDD and a lower voltage level VSS). Instead, the cell 102a utilizes intermediate gate connection metal layer 108 to be connected to the power supply terminals. As such, routing resources in the M1 layer 112 can be saved and more M1 layer tracks can be used for routing.

Specifically, two fin structures 104a and 104b (collectively 104) are located in the cell 102a and extend in an X direction. In one example, the fin structure 104a is for p-type devices such as p-type metal-oxide-semiconductor field-effect transistors (MOSFETs) and p-type fin field-effect transistors (FinFETs), though other types of devices may also be employed. Similarly, the fin structure 104b is for n-type devices such as n-type MOSFETs and n-type Fin-FETs, though other types of devices may also be employed.

Multiple gate ("poly") strips (i.e., gate structures) 110a, 110b, and 110c (collectively a gate strip layer 110) are deposited over the fin structures 104a and 104b, the distance between two of which is a contacted ploy pitch (CPP). Different technology nodes (e.g., 12 nm, 10 nm, and 7 nm) have different CPPs. The multiple gate strips 110a, 110b, and 110c extend in a Y direction. The Y direction is perpendicular to the X direction. The multiple gate strips 110a, 110b, and 110c may serve as gates of different devices.

Multiple intermediate fin structure connection metal tracks 106a, 106b, 106c, and 106d (collectively an intermediate fin structure connection metal layer 106) are deposited over the fin structures 104a and 104b respectively. The multiple intermediate fin structure connection metal tracks 106a, 106b, 106c, and 106d extend in the Y direction, in an interposed manner with respect to the multiple gate strips 110a, 110b, and 110c. The multiple intermediate fin structure connection metal tracks 106a, 106b, 106c, and 106d may serve as connections to sources or drains of different devices.

Multiple intermediate gate connection metal tracks 108a, 108b, and 108c (collectively an intermediate gate connection metal layer 108) are deposited over the intermediate fin structure connection metal layer 106 and the gate strip layer 110. The intermediate gate connection metal tracks 108a and 108b extend in the X direction and serve as connections to the power supply terminals. In the illustrated example in FIG. 1A, the intermediate gate connection metal track 108a is located at the top of the cell 102a and shared by the cell 102a and an upper neighboring cell in the Y direction (not shown); the intermediate gate connection metal track 108b is located at the bottom of the cell 102a and shared by the cell 102a and a lower neighboring cell in the Y direction (not shown). In the illustrated example in FIG. 1A, the intermediate gate connection metal track 108a is connected to VDD; the intermediate gate connection metal track 108b is connected to VSS. On the other hand, the intermediate gate connection metal track 108c is deposited over the gate strip 110b.

Multiple M1 metal tracks 112a, 112b, 112c, 112d, and 112e (collectively the M1 layer 112) are deposited over the intermediate fin structure connection metal layer 106, the intermediate gate connection metal layer 108, and the gate strip layer 110. The intermediate fin structure connection metal layer 106 and the intermediate gate connection metal layer 108 are intermediate layers between the fin structures 104a and 104b and the M1 layer 112. In the illustrated example in FIG. 1A, the M1 metal tracks 112a, 112b, 112c, 112d, and 112e extend in the X direction and may apply signals to different devices. In the illustrated example in FIG. 1A, the M1 metal tracks 112a, 112b, 112c, 112d, and 112e represent a condensed-placement scenario, where the distances between any neighboring two of the M1 metal tracks 112a, 112b, 112c, 112d, and 112e are equal to a minimum metal pitch (MMP). Similarly, different technology nodes (e.g., 12 nm, 10 nm, and 7 nm) have different MMPs. In summary, five M1 metal tracks 112a, 112b, 112c, 112d, and 112e can be placed in the Y direction within the cell height CH because the intermediate gate connection metal tracks 108a and 108b serve as connections to VDD and VSS respectively. By contrast, only four metal tracks at most can be placed in the Y direction within the same cell height CH in a benchmark cell. Specifically, because two M1 metal tracks are used for the connections to power supply terminals (e.g., VDD and VSS) respectively, only four M1 metal tracks can be placed in the benchmark cell with the reduced cell height CH. In other words, the cell height CH is not large enough to accommodate five M1 metal track when complying with the restriction of MMP. As such, when the cell height is reduced to CH, the cell 102 can have more M1 metal tracks for routing than the benchmark cell does.

Multiple vertical interconnect accesses (VIAs) 114a and 114b (collectively 114) are deposited to connect the M1 layer 112 to different devices. In the illustrated example in FIG. 1A, the VIA 114b is used to connect the gate strip 110b, and therefore the M1 metal track 112c is connected to the gate strip 110b and a gate signal can be applied to the M1 metal track 112c. The VIA 114a is used to connect the intermediate fin structure connection metal track 106c, and therefore the M1 metal track 112b is connected to a drain (in this example) of a device and a drain signal can be applied to the M1 metal track 112b.

Now referring to FIG. 1B, the illustrated cross section diagram is taken at the line A-A' and reflects a source/drain location of devices. Specifically, the fin structures 104a and 104b are deposited on a substrate 190. The intermediate fin structure connection metal 106a, extending in the Y direction, is deposited on the fin structure 104a and serves as a connection to a source. The intermediate fin structure connection metal 106b, extending in the Y direction, is deposited on the fin structure 104b and serves as a connection to a drain.

The intermediate gate connection metal track 108a is deposited on the intermediate fin structure metal track 106a. As such, the fin structure 104a, specifically the source as explained above, is connected to the intermediate gate connection metal track 108a, which is in turn connected to VDD. The intermediate gate connection metal track 108b is deposited at the bottom of the cell 102a in the Y direction. As such, the fin structure 104b, specifically the drain as explained above, can be connected (if needed) to the intermediate gate connection metal track 108b, which is in turn connected to VSS. The manner in which the intermediate gate connection metal tracks 108a and 108b are connected to power supply terminals will be described in detail below with reference to FIG. 2A and FIG. 2B.

Five M1 metal tracks 112a, 112b, 112c, 112d, and 112e are deposited over the intermediate fin structure connection metal layer 106, the intermediate gate connection metal layer 108, and the gate strip layer 110. Since the intermediate gate connection metal tracks 108a and 108b serve as the connections to VDD and VSS respectively, all of the five M1 metal tracks 112a, 112b, 112c, 112d, and 112e can be used for routing.

Figure 2A:
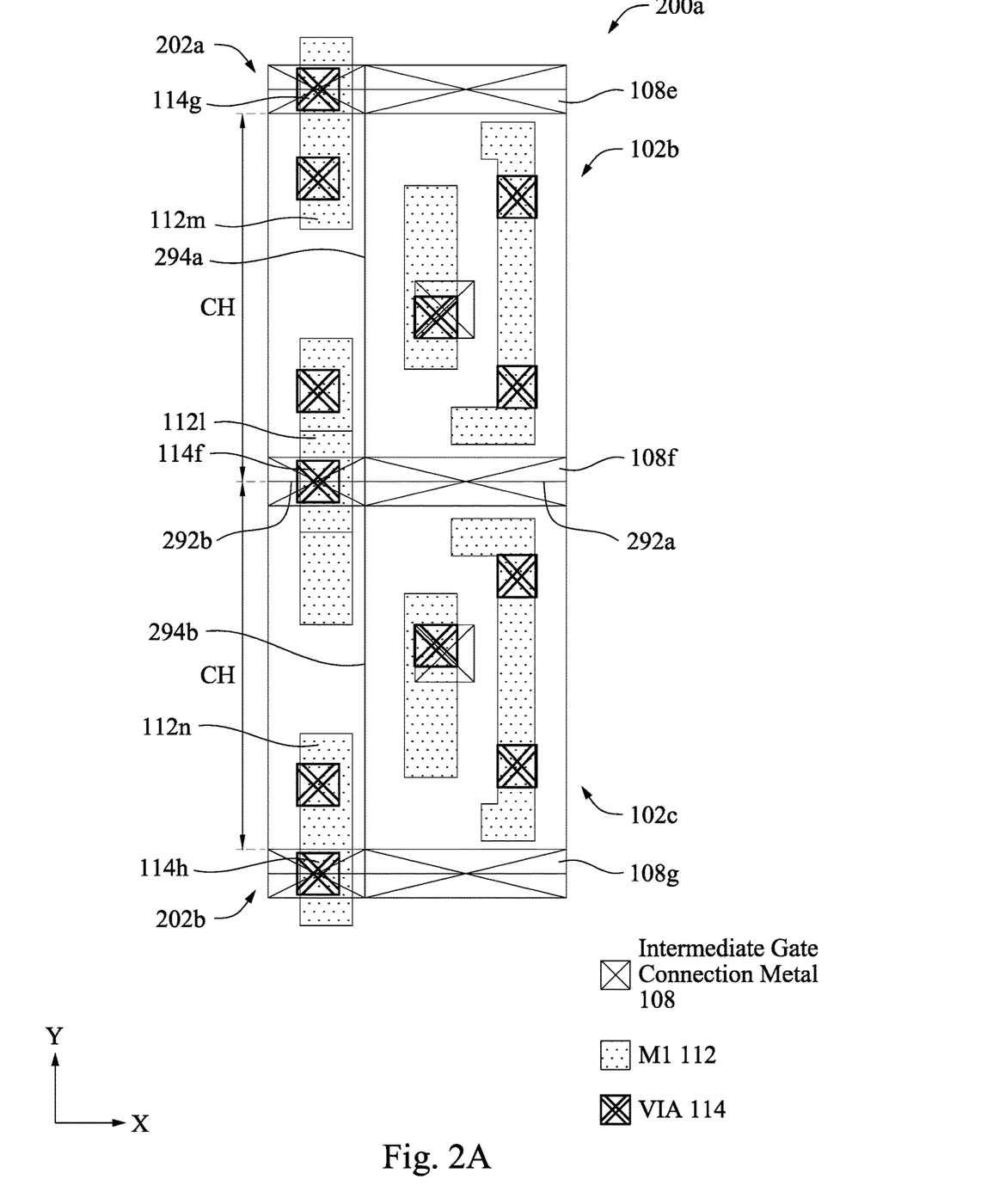
FIG. 2A is a layout diagram illustrating a cell assembly in accordance with some embodiments.
Figure 2B:
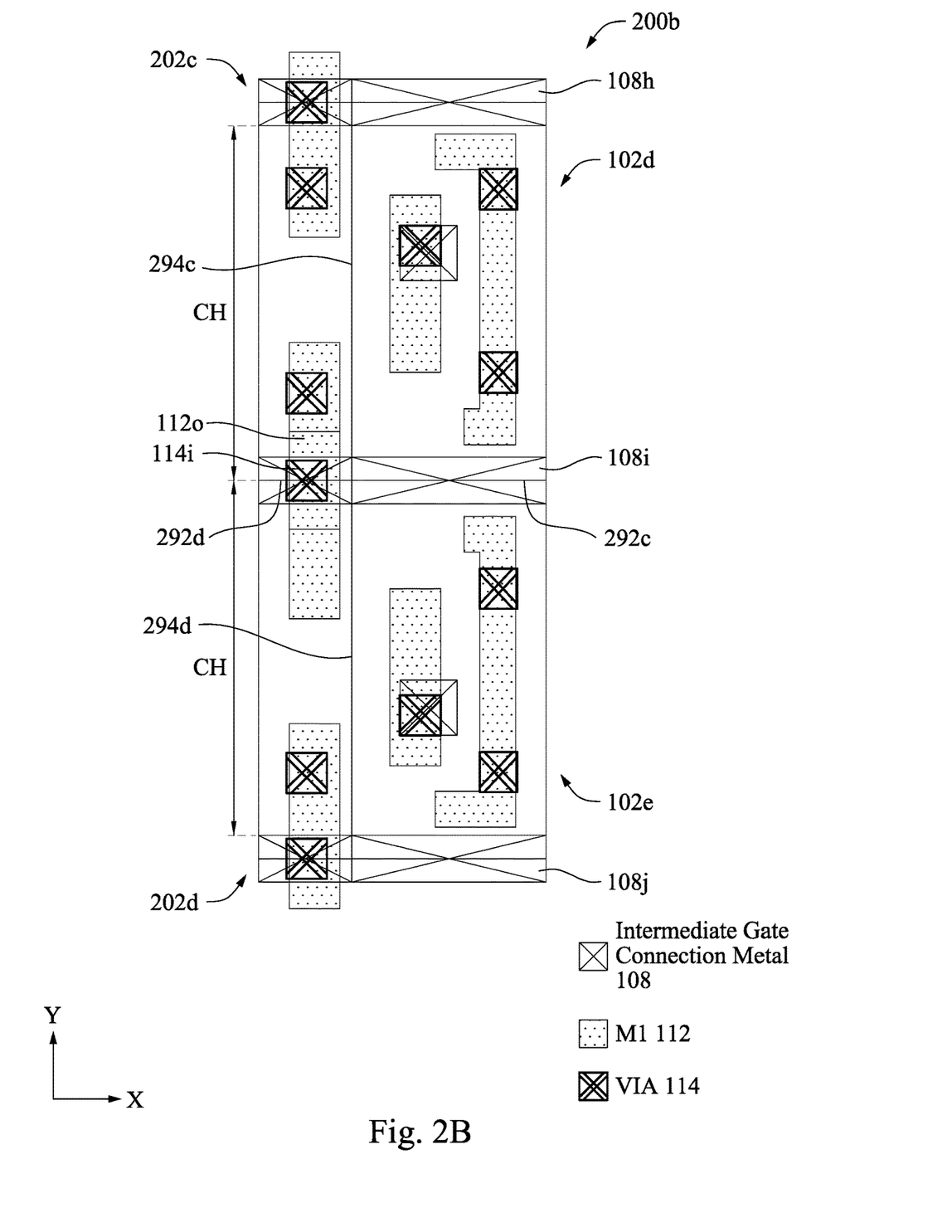
FIG. 2B is a layout diagram illustrating another cell assembly in accordance with some embodiments.

FIG. 2A is a layout diagram illustrating a cell assembly 200a in accordance with some embodiments. FIG. 2B is a layout diagram illustrating another cell assembly 200b in accordance with some embodiments. Generally, the assembly 200a includes two cells 102b, 102c and two power connecting cells 202a and 202b in a VSS-abutting configuration; the assembly 200b includes two cells 102d, 102e and two power connecting cells 202c and 202d in a VDD-abutting configuration.

Specifically, as illustrated in FIG. 2A, the cells 102b and 102c, like the cell 102a in FIG. 1A and FIG. 1B, both have two intermediate gate connection metal tracks for connections to the power supply terminals. The cell 102b abuts the cell 102c at a common boundary 292a extending in the X direction. The cell 102b has an intermediate gate connection metal track 108e for connection to VDD and an intermediate gate connection metal track 108f for connection to VSS. The cell 102c has the intermediate gate connection metal track 108f for connection to VSS and an intermediate gate connection metal track 108g for connection to VDD. As such, the intermediate gate connection metal track 108f is located in and shared by both the cell 102b and the cell 102c.

The power connecting cell 202a abuts the cell 102b at a common boundary 294a in the Y direction. The power connecting cell 202a has the same intermediate gate connection metal tracks 108e and 108f with the cell 102b at its top and bottom respectively. Similarly, the power connecting cell 202b abuts the cell 102c at a common boundary 294b in the Y direction. The power connecting cell 202b has the same intermediate gate connection metal tracks 108f and 108g with the cell 102c at its top and bottom respectively. The power connecting cell 202a abuts the power connecting cell 202b at a common boundary 292b extending in the X direction and share the intermediate gate connection metal track 108f, namely in the VSS-abutting configuration.

The power connecting cells 202a and 202b provide the cells 102b and 102c respectively with connections to VDD and VSS. Specifically, VSS can be applied to a M1 metal track 112l, and the M1 metal track 112l is further electrically connected to the intermediate gate connection metal track 108f through a VIA 114f. VDD can be applied to a metal track 112m, and the M1 metal track 112m is further electrically connected to the intermediate gate connection metal track 108e through a VIA 114g. Additionally, VDD can also be applied to a metal track 112n, and the M1 metal track 112n is further electrically connected to the intermediate gate connection metal track 108g through a VIA 114h. As such, the power connecting cells 202a and 202b can save routing resources in the M1 layer 112 within the cells 102b and 102c respectively.

The power connecting cells 202a and 202b may have different widths in the X direction. In one example, the power connecting cells 202a and 202b both have a width of one CPP. In another example, the power connecting cells 202a and 202b both have a width of two CPPs. In yet another example, the power connecting cells 202a and 202b both have a width of three CPPs. In yet another example, the power connecting cells 202a and 202b both have a width of ten CPPs. Accordingly, the power connecting cells 202a and 202b may share different numbers of VIAs 114 over the intermediate gate connection metal track 108f. In one example, the power connecting cells 202a and 202b share one VIA 114. In another example, the power connecting cells 202a and 202b share two VIAs 114. In yet another example, the power connecting cells 202a and 202b share three VIAs 114. In yet another example, the power connecting cells 202a and 202b share ten VIAs 114.

Likewise, as illustrated in FIG. 2B, the cells 102d and 102e, like the cell 102a in FIG. 1A and FIG. 1B, both have two intermediate gate connection metal tracks for connections to the power supply terminals. The power connecting cells 202c and 202d provide the cells 102d and 102e respectively with connections to VDD and VSS. As such, the power connecting cells 202c and 202d can save routing resources in the M1 layer 112 within the cells 102d and 102e respectively. The difference between the assembly 200a and the assembly 200b is that the power connecting cell 202c abuts the power connecting cell 202d at a common boundary 292d extending in the X direction and share the intermediate gate connection metal track 108i, namely in the VDD-abutting configuration. For simplicity, details of the assembly 200b are not described.

Figure 3:
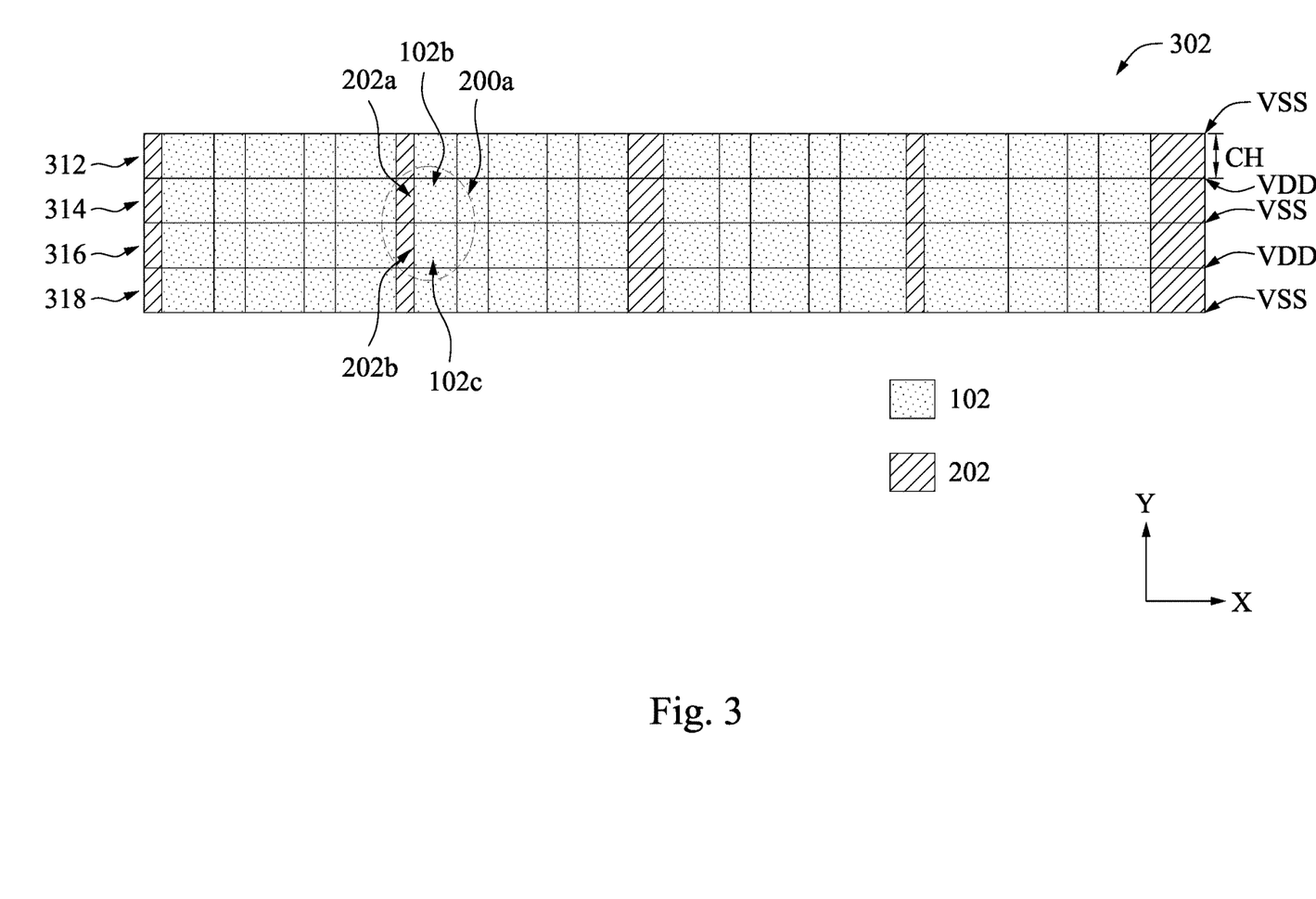
FIG. 3 is a structural diagram illustrating an IC incorporating both cells and power connecting cells in accordance with some embodiments.

FIG. 3 is a structural diagram illustrating an IC 302 incorporating both cells 102 and power connecting cells 202 in accordance with some embodiments. Generally, the IC 302 includes different cells 102 and power connecting cells 202 arranged in rows and columns. The cells 102 and the power connecting cells 202 all have a reduced cell height CH. In the illustrated example in FIG. 3, the IC 302 has four rows 312, 314, 316, and 318. Within each row, there is one power connecting cell 202 for every several cells 102 and the power connecting cell 202 provides the several cells 102 with connections to VDD and VSS. Neighboring power connecting cells 202 in the same column has either a VDD-abutting configuration (as in FIG. 2B) or a VSS-abutting configuration (as in FIG. 2A). In the illustrated example in FIG. 3, the assembly 200a in the FIG. 2A is incorporated into the IC 302. The assembly 200a includes the cells 102b, 102c and the power connecting cells 202a and 202b.

It should be noted that the power connecting cells 202 may have different widths in the X direction for different columns. For example, the width in one column is 10 CPPs, the width in another column is 25 CPPs, and the width in yet another column is 40 CPPs, though other combinations of widths may also be employed.

It should also be noted that with the reduced height CH (e.g., 360 nm reduced from originally 384 nm), the FEOL patterns (i.e., fin structures 104, gate strips 110, intermediate fin structure connection metal tracks 106, and intermediate gate connection metal tracks 108 as shown in FIG. 1A) are still feasible in fabrication.

Figure 4:
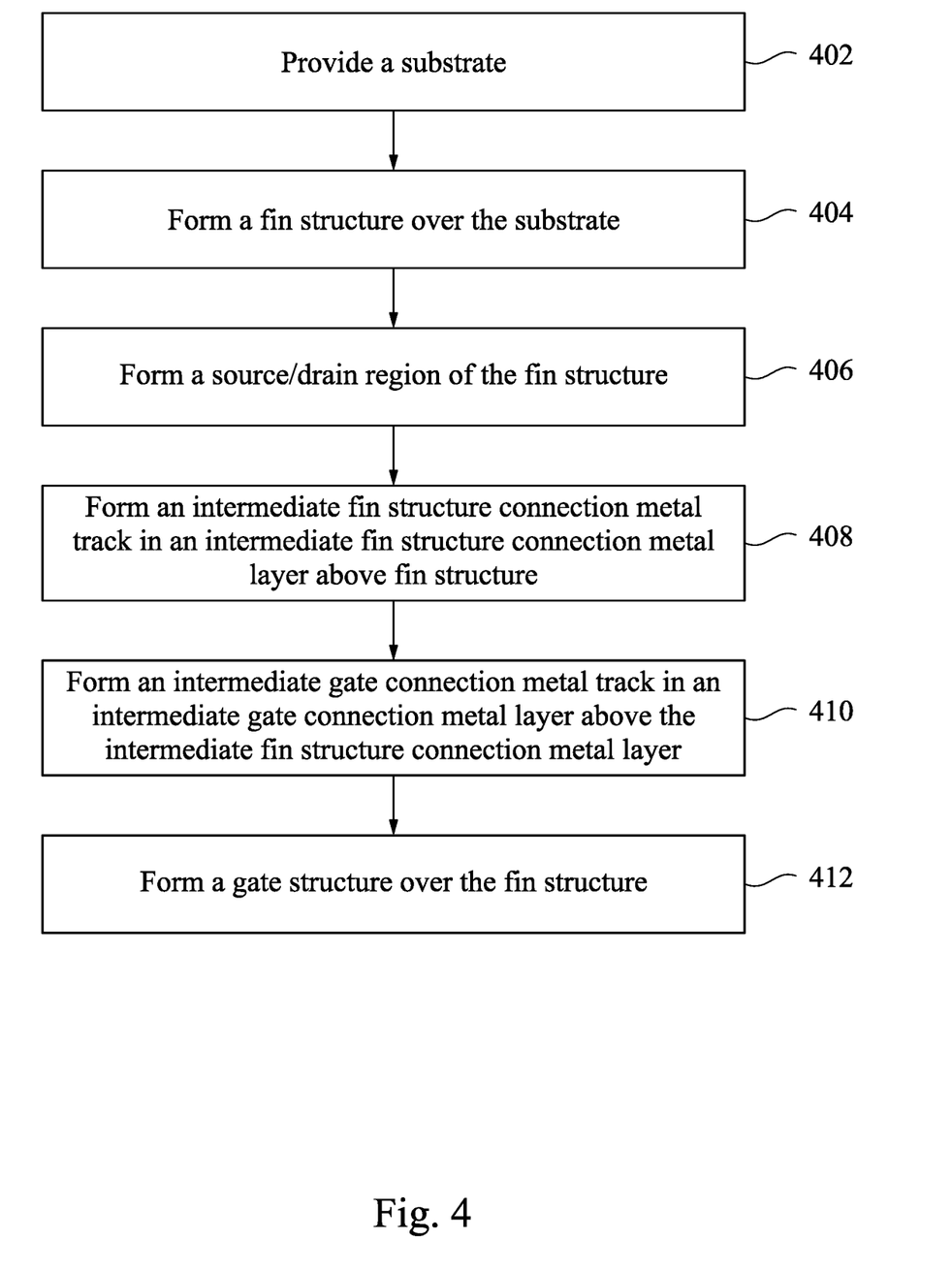
FIG. 4 is a flow chart diagram illustrating a method of fabricating a cell assembly on an integrated circuit in accordance with some embodiments.

FIG. 4 is flowchart diagram illustrating a method of fabricating a semiconductor structure on an integrated circuit in accordance with some embodiments. As shown in FIG. 4, a substrate is provided at step 402. In some examples, the substrate (e.g., the substrate 190 as shown in FIG. 1B) may be a bulk semiconductor substrate. In some embodiments, the semiconductor substrate is a silicon on insulator (SOI) substrate. In some embodiments, the substrate may include a plurality of epitaxial layers (i.e., a multilayer substrate). The substrate may include an elementary semiconductor such as silicon and germanium. Alternatively, the substrate may include a compound semiconductor such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; or combinations thereof. The substrate may include various regions that have been suitably doped (e.g., p-type or n-type conductivity). It should be noted that other types of substrate structures and semiconductor materials are also within the scope of the disclosure.

At step 404, a fin structure is formed over the substrate. The fin structure (e.g., the fin structure 104a as shown in FIG. 1B) comprises any suitable material. In one example, the fin structure extends in a first direction (e.g., the X direction as shown in FIG. 1A). In one example, the fin structure is a silicon fin structure. In another example, the fin structure may include multiple layers such as one or more epitaxial layers grown on the bulk semiconductor substrate and/or the bulk semiconductor substrate itself. The fin structure may be formed by any suitable process including various deposition, photolithography, etching, epitaxy, and/or other suitable processes. An exemplary photolithography process may include forming a photoresist layer ("resist") overlying the substrate, exposing the resist to a pattern by using a mask, performing a post-exposure bake process, and developing the resist to form a masking element including the resist. The masking element may then be used for etching to form the fin structure. The etching process may be reactive ion etching (RIE) processes and/or other suitable processes. In another example, the fin structure may be formed by a double-patterning lithography (DPL) process. DPL is a method of constructing a pattern on a substrate by dividing the pattern into two interleaved patterns. DPL allows enhanced fin structure density. Various DPL methodologies may be used including double exposure (e.g., using two mask sets), forming spacers adjacent to features and removing the features to provide a pattern of spacers, resist freezing, and/or other suitable processes. It should be noted that other types of fin structures and fin structure materials are also within the scope of the disclosure.

At step 406, a source/drain region of the fin structure is formed. In one example, the source/drain region of the fin structure is doped by performing implanting process to implant appropriate dopants to complement the dopants in the fin structure. In another example, the source/drain region of the fin structure is formed by forming a recess (not shown) in the fin structure and epitaxially growing material in the recess. It should be noted that other types of source/drain structures and forming processes are within the scope of the disclosure.

At step 408, an intermediate fin structure connection metal track is formed in an intermediate fin structure connection metal layer above fin structure. The intermediate fin structure connection metal track (e.g., the intermediate fin structure connection metal track 106a as shown in FIG. 1B) is in the intermediate fin structure connection metal layer. A portion of the intermediate fin structure connection metal track is above and connected to the source/drain region of the fin structure. In one example, the intermediate fin structure connection metal track extends in a second direction (e.g., the Y direction as shown in FIG. 1A) perpendicular to the first direction. The intermediate fin structure connection metal track may be formed by any suitable processes. In one example, the intermediate fin structure connection metal track is formed by forming an interlayer dielectric (ILD) (not shown) such as a low-k dielectric layer or extreme low-k dielectric layer over the source/drain region, patterning the ILD by using a mask to cover some portions of the ILD while leaving other portions of the ILD exposed, etching the ILD to remove the exposed portions of the ILD to form a recess, and depositing conductive contact material in the recess. The conductive contact material may be copper, tungsten, titanium, titanium nitride, other suitable materials, and/or combinations thereof. The deposition may be formed by atomic layer deposition (ALD), physical vapor deposition (PVD), chemical vapor deposition (CVD), e-beam evaporation, or other suitable process. It should be noted that other types of forming processes and materials are within the scope of the disclosure.

At step 410, an intermediate gate connection metal track is formed in an intermediate gate connection metal layer above the intermediate fin structure connection metal layer. The intermediate gate connection metal track (e.g., the intermediate gate connection metal track 108a as shown in FIG. 1B) is in the intermediate gate connection metal layer which is below a first metal (M1) layer. A portion of the intermediate gate connection metal track is above and connected to the intermediate fin structure connection metal track. In one example, the intermediate gate connection metal track extends in the first direction (e.g., the X direction as shown in FIG. 1A). The intermediate gate connection metal track may be formed by any suitable processes. In one example, the intermediate gate connection metal track is formed similarly by forming an ILD over the intermediate fin structure connection metal layer, patterning the ILD by using a mask to cover some portions of the ILD while leaving other portions of the ILD exposed, etching the ILD to remove the exposed portions of the ILD to form a recess, and depositing conductive contact material in the recess. The conductive contact material may be copper, tungsten, titanium, titanium nitride, other suitable materials, and/or combinations thereof. The deposition may be formed by ALD, PVD, CVD, e-beam evaporation, or other suitable process. It should be noted that other types of forming processes and materials are within the scope of the disclosure. The intermediate gate connection metal track may be later connected to a power supply terminal.

At step 412, a gate structure is formed over the fin structure. The gate structure (e.g., the gate strip 110b as shown in FIG. 1A) may include a gate dielectric layer, a gate electrode layer, and/or other suitable layers such as capping layers, interface layers, work function layers, diffusion/barrier layers, etc. The gate structure and/or fin structure may be patterned such that the gate structure wraps around a portion of the fin structure. In one example, the gate structure may contact at least three surfaces of the fin structure (e.g., the top and opposing side surfaces). In another example, the gate structure wraps around or quasi-around the fin structure such that the gate structure contacts a fourth surface of the fin structure (e.g., the bottom surface). The gate dielectric layer comprises a dielectric material, such as silicon oxide, silicon nitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. It should be noted that other gate structures and materials are within the scope of the disclosure.

Although not shown, first metal (M1) layer and higher level metal layers can also be formed during back-end-of-line (BEOL) processing to build electrical interconnect for the integrated circuit. It should be noted that the method steps in FIG. 4 may be performed in a different order, and the method may comprise additional method steps which are not listed in FIG. 4.

In accordance with some disclosed embodiments, a cell on an integrated circuit is provided. The cell includes: a fin structure; an intermediate fin structure connection metal track disposed in an intermediate fin structure connection metal layer above the fin structure, the intermediate fin structure connection metal track being connected to the fin structure; and a first intermediate gate connection metal track disposed in an intermediate gate connection metal layer above the intermediate fin structure connection metal layer, the first intermediate gate connection metal track being connected to the intermediate fin structure connection metal track. A first power supply terminal is connected to the intermediate gate connection metal track.

In accordance with some disclosed embodiments, a cell assembly on an integrated circuit is provided. The cell assembly includes: a power connecting cell providing a first power supply terminal; a cell, the power connecting cell being a first neighboring cell of the cell in a first direction; and a first intermediate gate connection metal track. The cell further includes: a fin structure; and an intermediate fin structure connection metal track disposed in an intermediate fin structure connection metal layer above the fin structure, the intermediate fin structure connection metal track being connected to the fin structure. The first intermediate gate connection metal track extends in the first direction and is disposed in an intermediate gate connection metal layer above the intermediate fin structure connection metal layer. The first intermediate gate connection metal track is connected to the intermediate fin structure connection metal track in the cell and connected to the first power supply terminal in the power connecting cell.

In accordance with further disclosed embodiments, a method of fabricating a semiconductor structure on an integrated circuit is provided. The method includes: forming a fin structure over a substrate; forming an intermediate fin structure connection metal track in an intermediate fin structure connection metal layer above the fin structure, the intermediate fin structure connection metal track being connected to the fin structure; and forming a first intermediate gate connection metal track in an intermediate gate connection metal layer above the intermediate fin structure connection metal layer, the first intermediate gate connection metal track being connected to the intermediate fin structure connection metal track, wherein the intermediate gate connection metal track is connected to a first power supply terminal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cell on an integrated circuit, comprising:
   a fin structure;
   an intermediate fin structure connection metal track disposed in an intermediate fin structure connection metal layer above the fin structure, the intermediate fin structure connection metal track being connected to the fin structure;
   a first intermediate gate connection metal track disposed in an intermediate gate connection metal layer above the intermediate fin structure connection metal layer, the first intermediate gate connection metal track being connected to the intermediate fin structure connection metal track; and
   a second intermediate gate connection metal track disposed in the intermediate gate connection metal layer, wherein both the first intermediate gate connection metal track and the second intermediate gate connection metal track extend in a first direction, wherein the first intermediate gate connection metal track is located at a top of the cell in a second direction perpendicular to the first direction, and wherein the second intermediate gate connection metal track is located at a bottom of the cell in the second direction.

2. The cell of claim 1, further comprising a plurality of metal tracks disposed in a first metal (M1) layer above the intermediate gate connection metal layer, wherein the plurality of metal tracks are parallel to each other and extend in the first direction, and wherein no power supply terminal is connected to the plurality of metal tracks.

3. The cell of claim 2, wherein the cell has a cell height in the second direction, wherein up to five metal tracks of the plurality of metal tracks fit into the cell height.

4. The cell of claim 1, wherein a first power supply terminal is connected to the first intermediate gate connection metal track through a power connecting cell.

5. The cell of claim 4, wherein the power connecting cell has a width of one contacted ploy pitch (CPP).

6. The cell of claim 1, wherein the first intermediate gate connection metal track is connected to a power connecting cell through a vertical interconnect access (VIA).

7. The cell of claim 1, wherein the first intermediate gate connection metal track is over a boundary line between the cell and a second neighboring cell of the cell in the second direction perpendicular to the first direction.

8. A cell assembly on an integrated circuit, comprising:
   a power connecting cell providing a first power supply terminal;
   a cell, the power connecting cell being a first neighboring cell of the cell in a first direction, wherein the cell further comprises:
      a fin structure; and
      an intermediate fin structure connection metal track disposed in an intermediate fin structure connection metal layer above the fin structure, the intermediate fin structure connection metal track being connected to the fin structure;
   a first intermediate gate connection metal track extending in the first direction and disposed in an intermediate gate connection metal layer above the intermediate fin structure connection metal layer, wherein the first intermediate gate connection metal track is connected to the intermediate fin structure connection metal track in the cell; and
   a second intermediate gate connection metal track disposed in the intermediate gate connection metal layer, wherein both the first intermediate gate connection metal track and the second intermediate gate connection metal track extend in the first direction, wherein the first intermediate gate connection metal track is located at a top of the cell in a second direction perpendicular to the first direction, and wherein the second intermediate gate connection metal track is located at a bottom of the cell in the second direction.

9. The cell assembly of claim 8, wherein the first intermediate gate connection metal track is over a boundary line between the cell and a second neighboring cell of the cell in the second direction.

10. The cell assembly of claim 8, wherein the first intermediate gate connection metal track extends outside the cell and is connected to the power connecting cell.

11. The cell assembly of claim 8, wherein a plurality of metal tracks are disposed in a first metal (M1) layer above the intermediate gate connection metal layer, and wherein no power supply terminal is connected to the plurality of metal tracks.

12. The cell assembly of claim 8, wherein the first intermediate gate connection metal track is connected to the first power supply terminal through a vertical interconnect access (VIA).

13. The cell assembly of claim 8, wherein the power connecting cell has a width of one contacted ploy pitch (CPP).

14. The cell assembly of claim 8, wherein the first intermediate gate connection metal track is connected to a first power supply terminal, and wherein a second power supply terminal is connected to the second intermediate gate connection metal track.

15. A method of fabricating a cell structure on an integrated circuit, comprising:
    forming a fin structure over a substrate;
    forming an intermediate fin structure connection metal track in an intermediate fin structure connection metal layer above the fin structure, the intermediate fin structure connection metal track being connected to the fin structure;
    forming a first intermediate gate connection metal track in an intermediate gate connection metal layer above the intermediate fin structure connection metal layer, the first intermediate gate connection metal track being connected to the intermediate fin structure connection metal track; and
    forming a second intermediate gate connection metal track disposed in the intermediate gate connection metal layer, wherein both the first intermediate gate connection metal track and the second intermediate gate connection metal track extend in a first direction, wherein the first intermediate gate connection metal track is located at a top of the cell in a second direction perpendicular to the first direction, and wherein the second intermediate gate connection metal track is located at a bottom of the cell in the second direction.

16. The method of claim 15, wherein the fin structure extend in the first direction, and wherein the intermediate fin structure connection metal track extends in the second direction perpendicular to the first direction.

17. The method of claim 15, wherein the intermediate fin structure connection metal layer and the intermediate gate connection metal layer are below a first metal (M1) layer.

18. The method of claim 15, wherein a first power supply terminal is connected to the first intermediate gate connection metal track through a power connecting cell.

19. The method of claim 15, wherein a second power supply terminal is connected to the second intermediate gate connection metal track.

20. The method of claim 15, wherein the cell structure has a cell height in the second direction, wherein up to five metal tracks of the plurality of metal tracks fit into the cell height.

* * * * *